United States Patent
Lin et al.

(10) Patent No.: US 11,482,403 B1
(45) Date of Patent: Oct. 25, 2022

(54) THIN-FILM-DEPOSITION EQUIPMENT FOR DETECTING SHIELDING MECHANISM

(71) Applicant: SKY TECH INC., Hsinchu County (TW)

(72) Inventors: Jing-Cheng Lin, Hsinchu County (TW); Yu-Te Shen, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 0 days.

(21) Appl. No.: 17/507,262

(22) Filed: Oct. 21, 2021

(30) Foreign Application Priority Data

Sep. 30, 2021 (TW) .................................. 110136587

(51) Int. Cl.
*H01J 37/34* (2006.01)
*H01J 37/32* (2006.01)
*C23C 14/34* (2006.01)

(52) U.S. Cl.
CPC ........ *H01J 37/32651* (2013.01); *C23C 14/34* (2013.01); *H01J 37/3441* (2013.01); *H01J 37/3444* (2013.01); *H01J 37/3447* (2013.01)

(58) Field of Classification Search
CPC ............... H01J 37/3441; H01J 37/3444; H01J 37/3447; H01J 37/32651; C23C 14/34

USPC ...................................................... 204/298.11
See application file for complete search history.

(56) References Cited

U.S. PATENT DOCUMENTS

| 2003/0155234 A1* | 8/2003 | Feltsman | C23C 14/566 |
| | | | 118/712 |
| 2004/0182698 A1* | 9/2004 | Feltsman | C23C 14/566 |
| | | | 204/298.11 |
| 2019/0316251 A1* | 10/2019 | Tsai | C23C 14/021 |
| 2019/0348264 A1* | 11/2019 | Tsai | H01L 21/67196 |

* cited by examiner

*Primary Examiner* — Rodney G McDonald
(74) *Attorney, Agent, or Firm* — Chun-Ming Shih; HDLS IPR Services

(57) ABSTRACT

The present disclosure provides a thin-film-deposition equipment for detecting shielding mechanism, which includes a reaction chamber, a carrier, a shielding mechanism and two distance sensors. The carrier and the shielding mechanism is partially disposed within the reaction chamber. The shielding mechanism includes two shield unit and a driver. The driver interconnects and drives the two shield units to sway in opposite directions and into an open state and a shielding state. Each of the two shield unit is disposed with a reflective surface for each of the two distance sensors to respectively project optical beams onto and detect a distances therebetween when the two shield units are operated in the shielding state, such that to confirm that the shielding mechanism is in the shielding state.

20 Claims, 11 Drawing Sheets

THIN-FILM-DEPOSITION EQUIPMENT FOR DETECTING SHIELDING MECHANISM

CROSS-REFERENCE TO RELATED APPLICATIONS

This non-provisional application claims priority claim under 35 U.S.C. § 119(a) on Taiwan Utility Model No. 110136587 filed on Sep. 30, 2021, the entire contents of which are incorporated herein by reference.

TECHNICAL FIELD

The present disclosure relates to a thin-film-deposition equipment for detecting shielding mechanism, which mainly employ two distance sensors to detect and confirm a shielding state the shielding mechanism.

BACKGROUND

Thin-film-deposition equipments, such as chemical-vapor deposition (CVD), physical-vapor deposition (PVD) and the atomic-layer deposition (ALD) equipments, those are commonly employed in manufacturing process of semiconductors, light-emitting diodes and displays, etc.

A thin-film-deposition equipment mainly includes a chamber and a substrate carrier, wherein the substrate carrier is within the chamber for carrying at least one substrate. To exemplify by PVD, a target material is required to dispose within the chamber, wherein the target material faces the substrate on the substrate carrier. When performing PVD, noble gas or reactive gas is transferred into the chamber, then bias electricity is applied on the target material and the substrate carrier respectively, also the substrate carried on by the substrate carrier is heated up.

The noble gas or reactive gas within the chamber transforms into ionized gas in effect of a high-voltage electric field, then the ionized gas is attracted by the bias electricity to bombard the target material. Thereby, atoms or molecules splashed from the target material are attracted by the bias electricity on the substrate carrier, then be deposited on surface of the substrate and forms a thin film on the surface of the substrate.

After some time of usage, an inner-edge surface of the chamber may also be formed with thin film, then a periodic cleaning is required to perform to the chamber, in order to prevent the waste thin film from dropping onto the substrate and causing pollution during the process of thin-film deposition. Moreover, surface of the target material may be formed with oxide or other pollutant, therefore requires a periodic cleaning as well. Generally, a burn-in process is applied to bombard the target material within the chamber by plasma ions, then to remove the oxides or pollutants on the surface of target material.

To perform the abovementioned cleaning process, the substrate carrier and the substrate must be extracted or kept out, to prevent the removed pollutant from turning to pollute the substrate carrier and the substrate, during the cleaning process.

SUMMARY

Generally, after some time of usage, the thin-film-deposition equipment is required for cleaning, in order to remove the waste thin film within the chamber and the oxide or nitride on the target material. During the cleaning process, some removed pollutant particles may turn to pollute the substrate carrier (hereafter as "carrier"), thus there is a need to keep out the substrate carrier from the removed pollutant. The present disclosure provides a shielding mechanism and a thin-film-deposition equipment with the same, which mainly employs a driver to rotate and swing two shield units in opposite rotational directions to approach or leave each other, such that to operate between a shielding state and an open state. Thereby, the shield units in shielding state can cover and shield the substrate carrier, to prevent the removed pollutant particles from turning to pollute the substrate carrier during the process of cleaning the chamber or the target material.

During a process of cleaning the reaction chamber, the driver swings the two shield units to approach each other, such that the two shield units come together to cover the carrier within a containing space, in order to prevent a plasma employed to proceed the cleaning or some removed waste pollutant from turning to pollute the substrate carrier and/or the substrate thereon. Alternatively, during a process of performing the deposition, the driver swings the two shielding members to leave each other, such that to permit the process to proceed on the substrate within the reaction chamber.

An object of the present disclosure is to provide a thin-film-deposition equipment with shielding mechanism, which includes a reaction chamber, a carrier and a shielding mechanism. The shielding mechanism includes a driver, two shield units and two distance sensors. Also, the driver is connected to the two shield units, for respectively driving the two shield units to sway in opposite rotational directions and thereby to move between an open state and a shielding state.

Each of the two shield units is disposed with a reflective surface. When the two shield units are operated into the shielding state, each of the two distance sensors respectively projects an optical beam onto the reflective surface of a corresponding one of the two shield units, and also detects, measures a distance therebetween, such that to confirm if the two shield units have been operated into the shielding state or not.

After the two distance sensors have confirmed that the two shield units have been operated into the shielding state, the thin-film-deposition equipment then begins a burn-in and cleaning process, such that to effectively prevent removed pollutants from turning to pollute the carrier or lower portion of the reaction chamber during the burn-in and cleaning process.

An object of the present disclosure is to provide the thin-film-deposition equipment, wherein the reaction chamber is disposed with two shield sensors, which are for respectively detecting and confirming the open state of the two shield units.

After the two shield sensors have confirmed that the two shield units have been operated into the open state, the thin-film-deposition equipment then moves the carrier and the substrate thereon upward and performs a thin-film deposition process. Such that, the thin-film-deposition equipment is able to prevent the carrier from moving upward when the two shield units are not exactly operated into the open state, and hence to prevent collision or even damage therebetween.

To achieve the abovementioned object, the present disclosure provides a thin-film-deposition equipment for detecting shielding mechanism, which includes: a reaction chamber including a containing space; a carrier disposed within the containing space for carrying at least one substrate; shielding mechanism, a first-distance sensor and a second-distance sensor. In more detail, the shielding mechanism includes: a first-shield unit disposed within the containing space and including a first-reflective surface; a second-shield unit disposed within the containing space and including a second-reflective surface; at least one driver interconnecting the first-shield unit and the second-shield unit and respectively driving and swinging the first-shield unit and the second-shield unit to move in opposite directions and between a shielding state and an open state, wherein in the shielding state, the first-shield unit and the second-shield unit approach each other, and wherein the first-shield unit and the second-shield unit have an open space therebetween. The first-distance sensor disposed on the reaction chamber for projecting a first-optical beam onto the first-reflective surface of the first-shield unit for detecting and confirming the shielding state of the first-shield unit. In the other hand, the second-distance sensor disposed on the reaction chamber for projecting a second-optical beam onto the second-reflective surface of the second-shield unit for detecting and confirming the shielding state of the second-shield unit.

The present disclosure also provides the aforementioned thin-film-deposition equipment, wherein the first-shield unit includes a first-connecting arm and a first-shield member; the driver is connected to the first-shield member via the first-connecting arm; the first-connecting arm is disposed with the first-reflective surface; the driver is connected to the second-shield member via the second-connecting arm; and the second-connecting arm is disposed with the second-reflective surface.

Furthermore, the present disclosure also provides the aforementioned thin-film-deposition equipment, wherein the first-connecting arm has a first protrusion disposed with the first-reflective surface; and the second-connecting arm has a second protrusion disposed with the second-reflective surface.

Alternatively, the present disclosure provides another thin-film-deposition equipment, wherein the shielding mechanism includes two drivers to respectively drive the first-shield unit and the second-shield unit in opposite directions, such that to swing the two shield units between the shielding state and the open state, meanwhile, with the two distance sensors to respectively detect the two shield units for confirmation of the shielding state as well.

To achieve the object, the present disclosure provides a thin-film-deposition equipment for detecting shielding mechanism, which includes: a reaction chamber including a containing space; a carrier disposed within the containing space for carrying at least one substrate; shielding mechanism, a first-distance sensor and a second-distance sensor. In more detail, the shielding mechanism includes: a first-shield unit disposed within the containing space and including a first-reflective surface; a second-shield unit disposed within the containing space and including a second-reflective surface; a first driver interconnecting a first-shield unit for driving and swinging the first-shield unit; and a second driver connected to the second-shield unit for driving and swinging the first-shield unit, wherein the first driver and the second driver respectively drive and swing the first-shield unit and the second-shield unit to move in opposite directions and between a shielding state and an open state, wherein in the shielding state, the first-shield unit and the second-shield unit approach each other, and wherein the first-shield unit and the second-shield unit have an open space therebetween. The first-distance sensor disposed on the reaction chamber for projecting a first-optical beam onto the first-reflective surface of the first-shield unit for detecting and confirming the shielding state of the first-shield unit. In the other hand, the second-distance sensor disposed on the reaction chamber for projecting a second-optical beam onto the second-reflective surface of the second-shield unit for detecting and confirming the shielding state of the second-shield unit.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
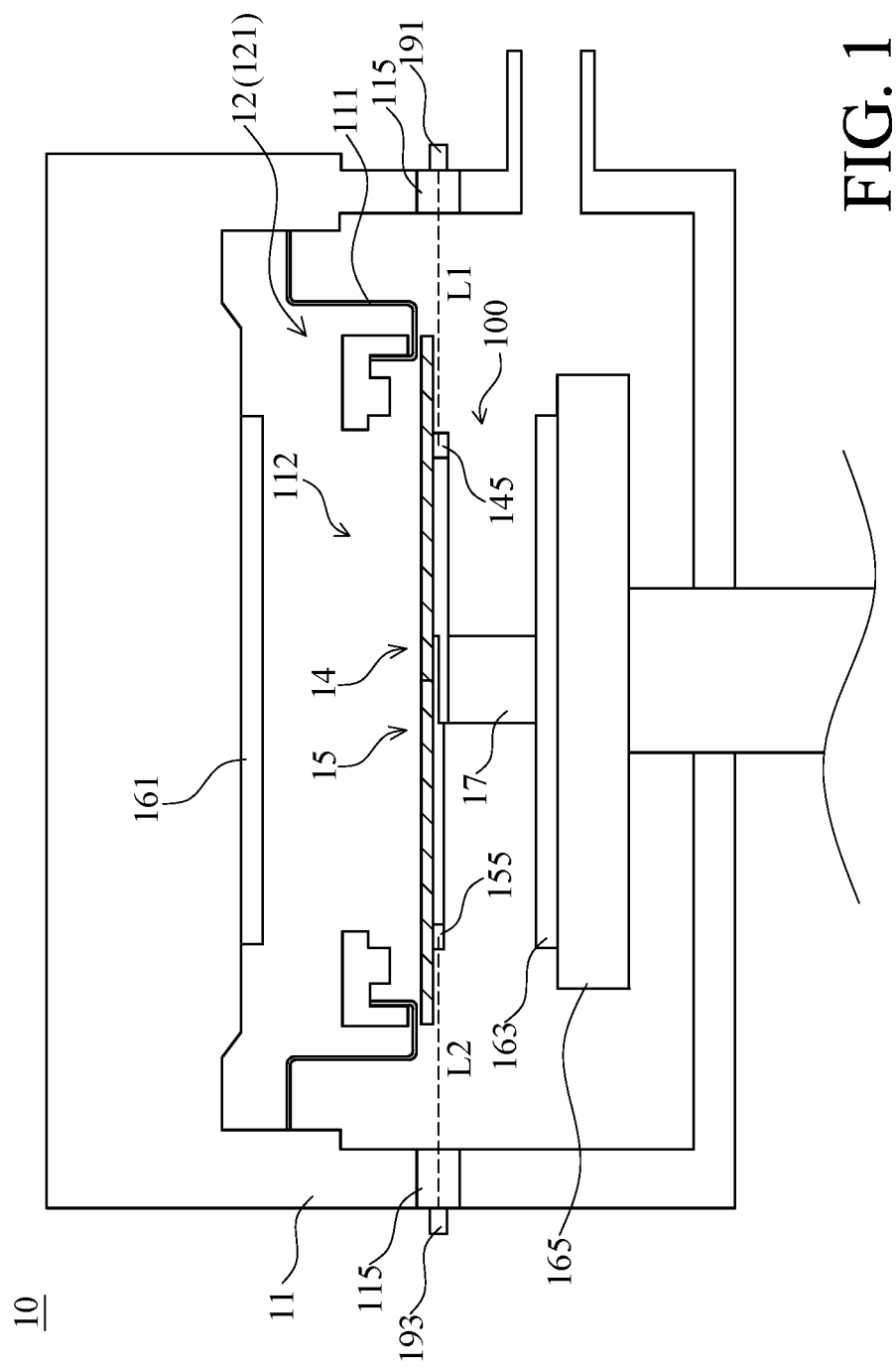
FIG. 1 is a schematic sectional view illustrating a thin-film-deposition equipment for detecting shielding mechanism which is operated into a shielding state, according to one embodiment of the present disclosure.

Referring to FIG. 1, which is a schematic sectional view illustrating of a thin-film-deposition equipment for detecting shielding mechanism 10 which is operated in a shielding state, according to one embodiment of the present disclosure. As shown in the FIG., the thin-film-deposition equipment for detecting shielding mechanism 10 (hereafter as "the thin-film-deposition equipment 10") mainly includes a reaction chamber 110, a carrier 165 and a shielding mechanism 100, wherein the reaction chamber 110 includes a containing space 12 for containing the carrier 165 and a portion of the shielding mechanism 100.

The carrier 165 is positioned within the containing space 12 of the reaction chamber 110, for carrying at least one substrate 163. In this embodiment, the thin-film-deposition equipment 10 is exemplified as a physical-vapor deposition chamber. The reaction chamber 110 is disposed within a target material 161 and has the target material 161 facing the carrier 165. Specifically, the target material 161 may be disposed on a ceiling surface of the reaction chamber 110 to face the carrier 165 and/or the substrate carried thereon within the containing space 12, for example.

Figure 2:
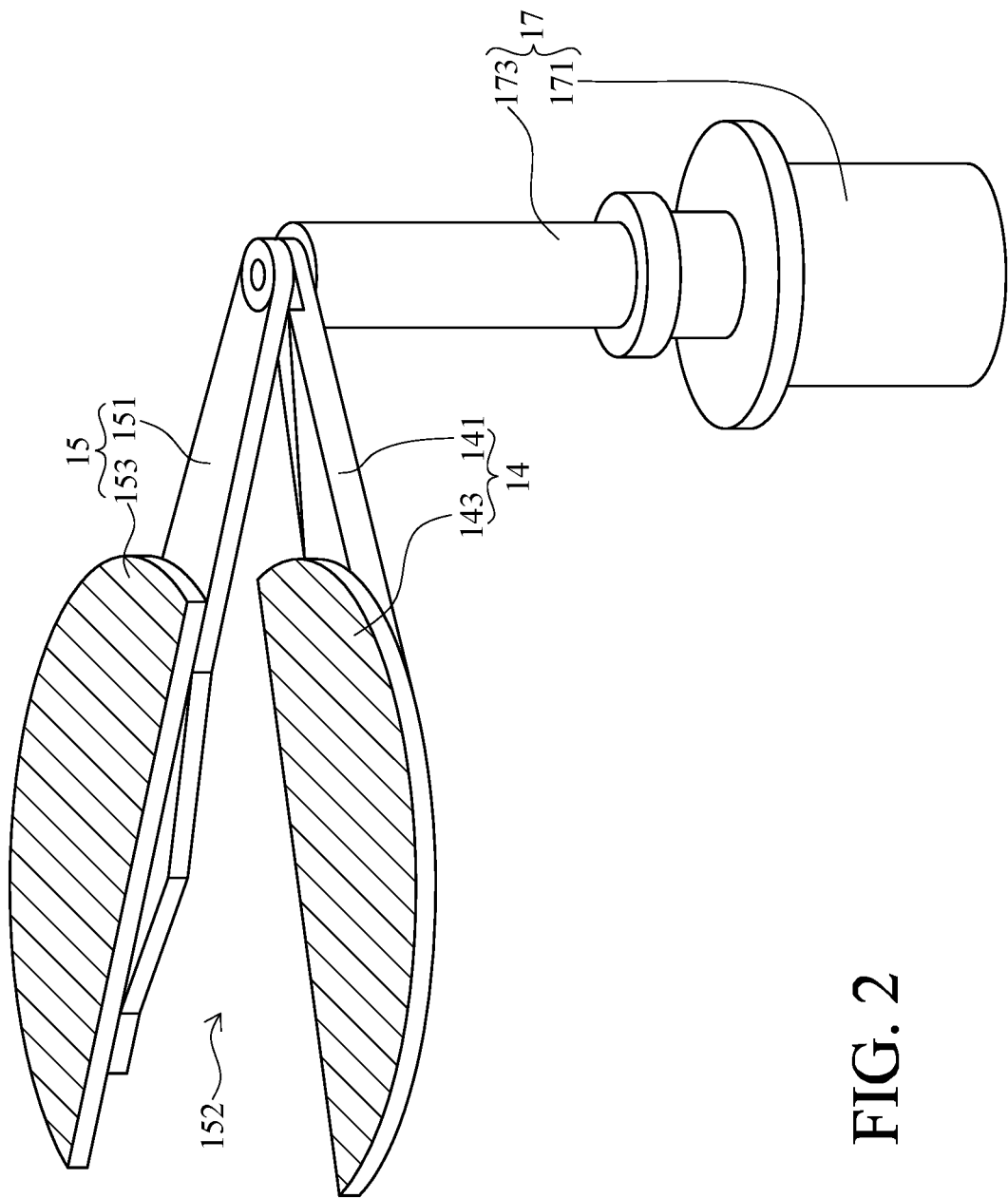
FIG. 2 is a schematic perspective view illustrating the shielding mechanism which is operated into an open state, according to one embodiment of the present disclosure.

Referring to FIG. 2, the shielding mechanism 100 includes a first-shield unit 14, a second-shield unit 15 and a driver 17, wherein the two shield units 14, 15 are disposed within the containing space 12.

In one embodiment of the present disclosure, the first-shield unit 14 includes a first-shield member 143, and a first-connecting arm 141 for carrying the first-shield member 143. In the other hand, the second-shield unit 15 includes a second-shield member 153, and a second-connecting arm 151 for carrying the second-shield member 153.

The driver 17 power-transmittably interconnects the first-shield member 143 and the second-shield member 153 respectively via the first-connecting arm 141 and the second-connecting arm 151, such that to drive, swing the first-shield member 143 and the second-shield member 153 in opposite direction (rotational directions), such as to have the two shield units 14, 15 swaying toward or away from each other synchronously, about an axle of the driver 17. Thereby, the driver 17 can drive and swing the two shield units 14, 15 away from each other into an open state, for the thin-film-deposition equipment 10 to perform a deposition process to the substrate 163 carried by the carrier 165. In an opposite manner, the driver 17 can drive and swing the two shield units 14, 15 toward each other into a shielding state, for the thin-film-deposition equipment 10 to perform a cleaning process, wherein the two shield units 14, 15 together cover the carrier 165 to prevent removed pollutants from turning to pollute the carrier 165.

The first-shield unit 143 of the first-shield unit 14 and the second-shield unit 153 of the second-shield unit 15 may be formed as plates with similar shapes, such as respectively formed as one half and another half of a round plate. Such that, as the driver 17 swings the first-connecting arm 141 and the second-connecting arm 151 to respectively move the first-shield unit 14 and the second-shield unit 15 toward each other, the two shield members 143, 153 come together and form a whole round shield (refer to FIG. 8), for covering and shielding the carrier 165 and/or the substrate 163 thereon.

However, the two shield-members 143, 153 with half-round appearances are merely one embodiment of the present disclosure, in other embodiment, the shield-members 143, 153 may be formed in different geometric shapes, such as rectangular shapes, or triangular shapes, etc. Moreover, the two shield members 143, 153 may also be formed with different area sizes, or even be disposed in different heights and overlap when in the shielding state (e.g. the first-shield member 143 partially on top of the second-shield member 153) for a better coverage.

Moreover, a manner of the first-shield unit 14 and the second-shield unit 15 being operated into the shielding state, which is defined as the first-shield member 143 of the first-shield unit 14 and the second-shield member 153 of the second-shield unit 15 continue to approach each other, until a distance between the two shield members 143, 153 is less than a threshold value, such as 1 millimeter (mm). To be specific, the first-shield member 143 and the second-shield member 153 do not actually contact each other, such that to avoid a collision or friction therebetween, which may create some wear-off particles therefrom to pollute the containing space 12 of the reaction chamber 110 and/or the carrier 165 therein.

Figure 7:
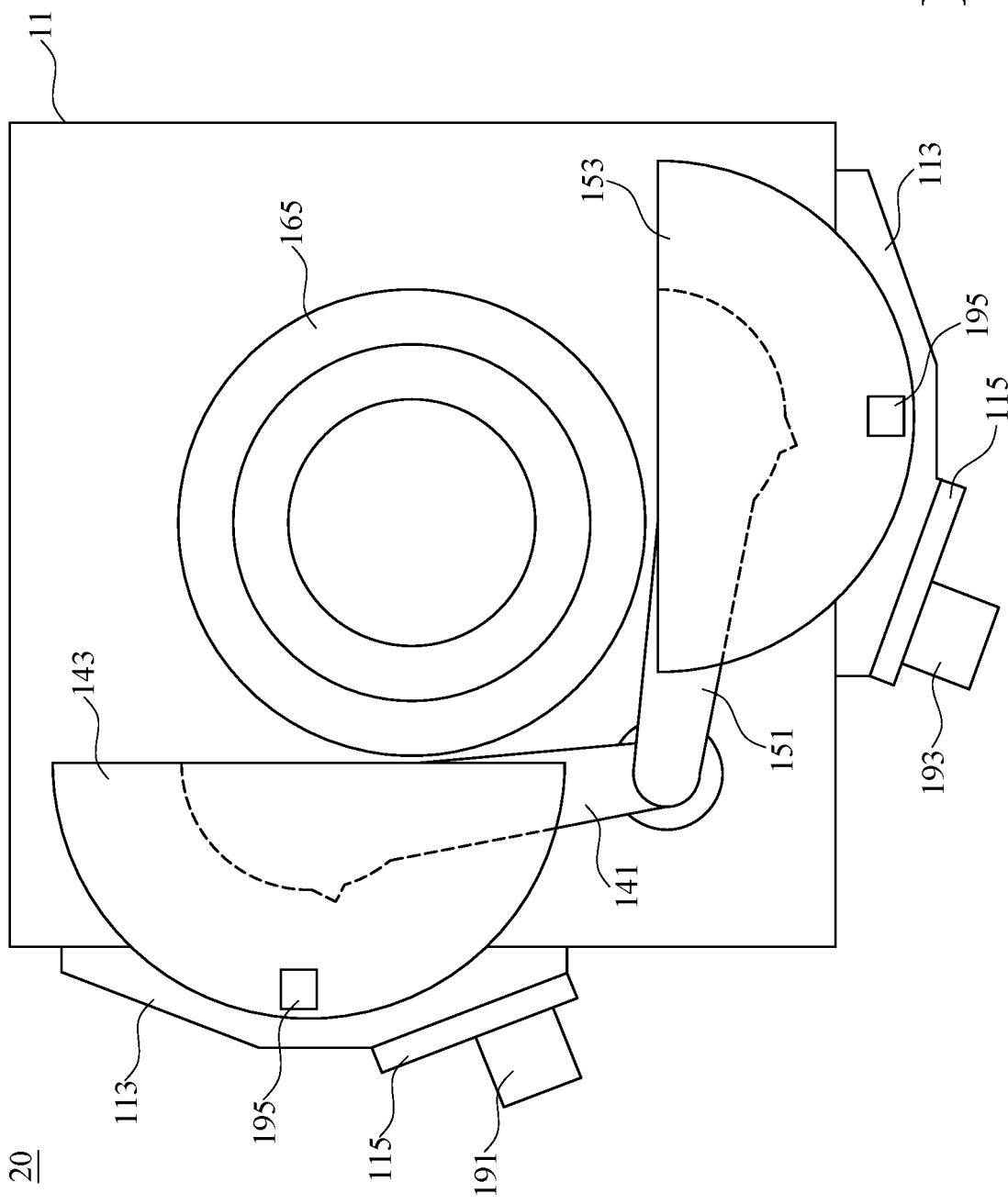
FIG. 7 is a schematic top view illustrating the thin-film-deposition equipment for detecting shielding mechanism which is operated into the open state, according to one different embodiment of the present disclosure.

As aforementioned, the thin-film-deposition equipment 10 and/or the shielding mechanism 100 according to the present disclosure, which can be operated to switch between two states as the open state and the shielding state. As shown in FIG. 2 and FIG. 7, the driver 11 can drive, swing the first-shield unit 14 and the second-shield unit 15 to leave each other and move into the open state. In the open state, the first-shield unit 14 and the second-shield unit 15 have an open space 152 therebetween, such that the first-shield unit 14 and the second-shield unit 15 do not get between the target material 161 and the carrier 165 with the substrate 163 thereon.

When the first-shield unit 14 and the second-shield unit 15 are operated into the open state, the carrier 165 can be driven by an elevating unit (not shown) to approach the target material 161. Thereafter, a process gas (e.g. noble gas) is employed to bombard the target material 161, in order to remove and deposit particles (e.g. atoms or molecules) of the target material 161 and form a thin film on a surface of the substrate carried on the carrier 165.

In one embodiment of the present disclosure as shown in FIG. 1, the containing space 12 of the reaction chamber 110 may be disposed with a tubular blocking member 111, which has one end connected to the ceiling surface of the reaction chamber 110, and another end formed with an opening 112. Such that, when the carrier 165 approaches the target material 161, the carrier 165 also enters the opening 112 or contacts the blocking 111. The reaction chamber 110, the carrier 165 and the blocking member 111 together define a reactive space within the containing space 12, for forming the thin film on the substrate within the reactive space, such that to prevent the blew-off particles of the target material 161 from spreading out of the reactive space and forming undesired thin film outside.

Figure 8:
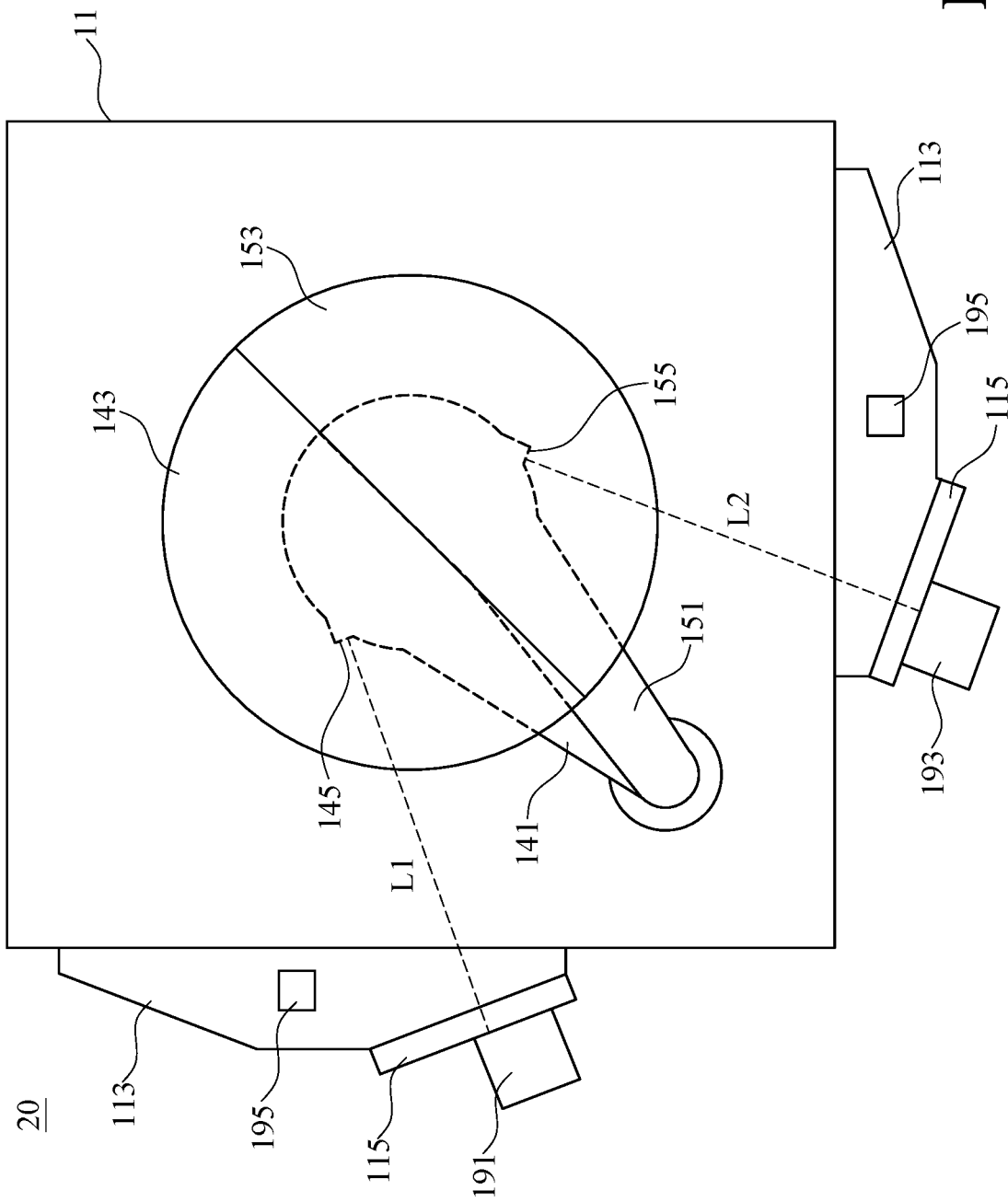
FIG. 8 is a schematic top view illustrating the thin-film-deposition equipment for detecting shielding mechanism which is operated into the shielding state, according to one different embodiment of the present disclosure.

In the opposite manner, as shown in FIG. 1 and FIG. 8, the driver 17 can drive, swing the first-shield unit 14 and the second-shield unit 15 to approach each other and move into the shielding state. In the shielding state, the first-shield unit 14 and the second-shield unit 15 come together and form the whole shield 15 between the target material 161 and the carrier 165, such that to cover and shield the carrier 165 from the target material 161.

As shown in FIG. 1, the shield 15 and the blocking member 111 together can define a cleaning space 121 within the containing space 12, wherein the cleaning space 121 and the aforementioned reactive space have partially or completely spatial overlap. A burn-in process may be performed within the cleaning space 121, to clean the target material 161, the ceiling surface of the reaction chamber 110 and/or an inside of the blocking member 111, and to remove oxides, nitrides or other pollutants on the target material 161, also to remove undesired, waste thin film within the reaction chamber 110 and/or the blocking member 111. During the cleaning process of the thin-film-deposition 10, the two shield units 14, 15 are operated into the shielding state, to form the whole shield 15 for keeping away those remove oxides, nitrides or other pollutants from the carrier 165 and/or the substrate 163 thereon.

Moreover, by virtue of two connecting arms 141, 151 to respectively carry one and another halves of the whole shield 15 as the first-shield member 143 and the second-shield member 153, which can reduce loadings of the connecting arms in comparison with conventional shielding mechanism. Also, as the whole shield 15 can be separate into half, this can also improve space efficiency of the reaction chamber, and hence no need of additional storage chamber for containing the shield 15 when not in use.

Figure 3:
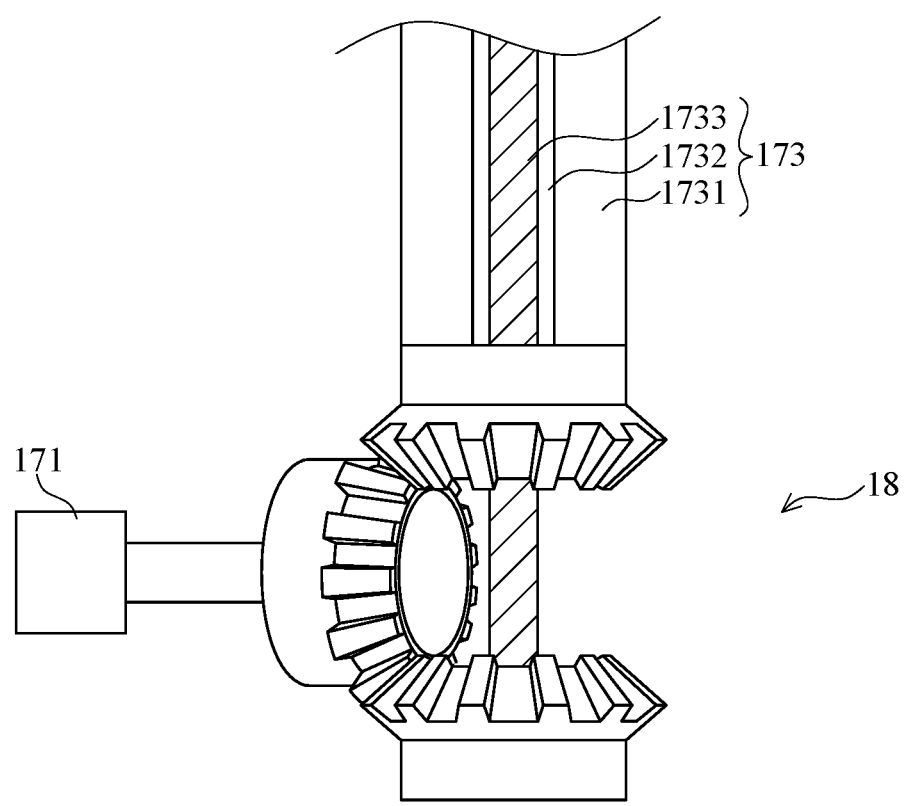
FIG. 3 is a schematic fragmentary perspective sectional view illustrating a driver of the shielding mechanism, according to one embodiment of the present disclosure.

In one embodiment of the present disclosure as shown in FIG. 3, the driver 17 includes at least one motor 171 and a shaft seal 173, wherein the motor 171 is power-transmittably connected to the first-shield unit 14 and the second-shield unit 15 via the shaft seal 173. Specifically, the motor 171 may be power-transmittably connected to the shaft seal 173 and the two shield units 14, 15 further via a gear mechanism 18, such that to drive and swing the first-shield unit 14 and the second-shield unit 15 to move in the opposite directions. Also to mention that, the motor 171 is disposed outside of the containing space 12 of the reaction chamber 11, on the other side, the shaft seal 173 is partially disposed outside of the containing space 12 for connecting to the motor 171 and partially extends into the containing space 12, such that to seal the containing space 12 and facilitate maintaining a vacuum condition therein.

In more detail, the shaft seal 173 includes an outer tube 1731, and a main shaft 1733 contained within the outer tube 1731, also, the outer tube 1731 and the main shaft 1733 are disposed in a coaxial manner and are rotatable relative to each other. As shown in FIG. 3, the gear mechanism 18 is such as a three-gear system, with two passive gears respectively mounted on the outer tube 1731 and the main shaft 1733, and with a drive gear meshing the two passive gears and power-transmittably connected to the motor 171, thereby to respectively turn the outer tube 1731 and the main shaft 1733 in the opposite directions and hence to swing the two shield units 14, 15 thereon into the shielding state and the open state.

The shaft seal 173 may be a common shaft seal component, which is mainly for isolating the containing space 12 of the reaction chamber 110 from an outside thereof and maintaining a vacuum condition within the containing space 12. In a different embodiment of the present disclosure, the shaft seal 173 may be a magnetic liquid rotary sealing, which includes a plurality of bearings, at least one permanent magnet, at least one pole piece and at least one ferrofluid.

Figure 4:
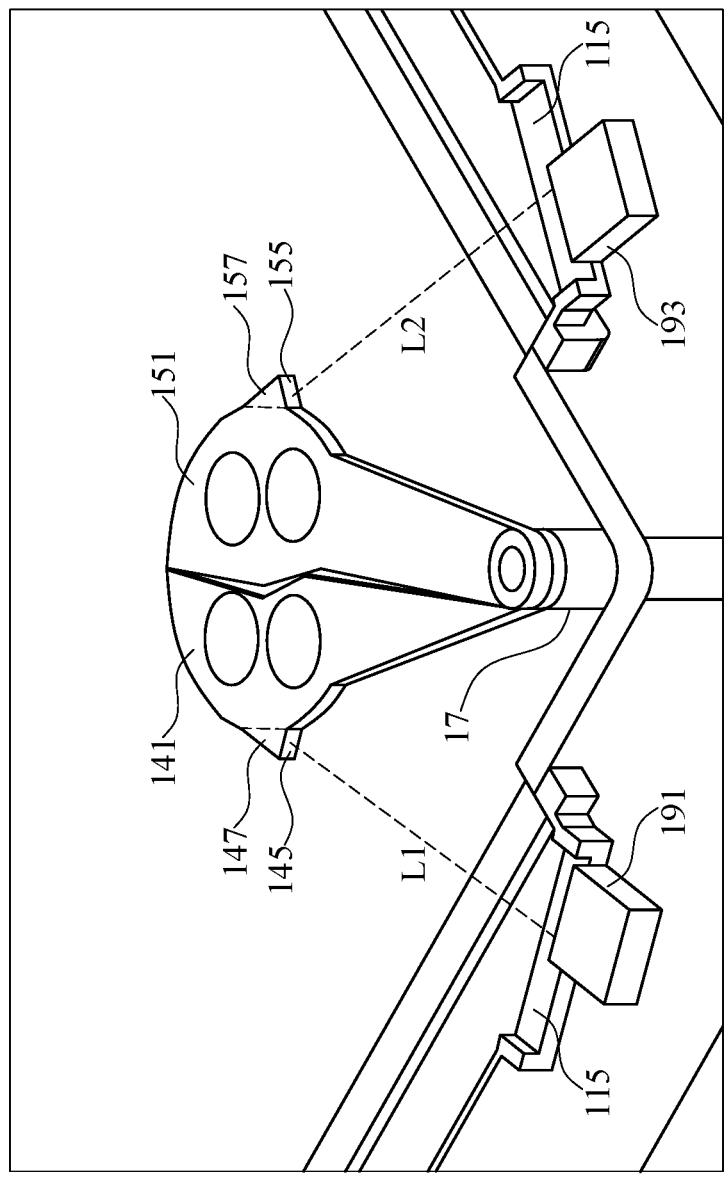
FIG. 4 is a schematic fragmentary perspective view illustrating the thin-film-deposition equipment for detecting shielding mechanism which is operated into the shielding state, according to one embodiment of the present disclosure.

According to the present disclosure, as shown in FIG. 4 and FIG. 8, the thin-film-deposition equipment 10 has the first-shield unit 14 disposed with a first-reflective surface 145, and has the second-shield unit 15 is disposed with a second-reflective surface 155. Furthermore, the thin-film-deposition equipment 10 includes a first-distance sensor 191 and a second-distance sensor 193 disposed on the reaction chamber 11, for respectively detecting the first-shield unit 14 and the second-shield unit 15 to confirm the shielding state thereof. In practical use, the first-distance sensor 191 and the second-distance sensor 193 may be optical rangefinders.

The first-distance sensor 191 is disposed on side of the first-shield unit 14, wherein the first-distance sensor 191 emits and projects an optical beam (L1) onto the first-shield unit 14. In practical use, a position of the first-distance sensor 191 may be configured, to have the optical beam (L1) thereof projected right on the first-reflective surface 145 of the first-shield unit 14 when the first-shield unit 14 into the shielding state. At this moment, the optical beam (L1) of the first-distance sensor 191 is threw by an emitter thereof and perpendicularly projected on the first-reflective surface 145 (parallel to a normal line of the surface 145), and then reflected by the first-reflective surface 145 and returns to a receiver of the first-distance sensor 191. Such that, the first-distance sensor 191 can measure a distance between the first-shield unit 14 and the first-distance sensor 191 itself, by such as estimating a time duration from the throw of the optical beam (L1) to the return of the optical beam (L1), or a reflective angle between the threw optical beam (L1) and the reflected optical beam (L1), etc. Thereby, the first-distance sensor 191 can confirm that the first-shield unit 14 has been operated into the shielding state when the distance substantially matches to a preset value corresponding to the shield state.

Similar to the first-distance sensor 191, the second-distance sensor 193 is disposed on side of the second-shield unit 15, and projects an optical beam (L2) onto the second-reflective surface 155 of the second-shield unit 15. At this moment, the optical beam (L2) of the second-distance sensor 193 is perpendicularly projected on the second-reflective surface 155, and then reflected by the second-reflective surface 155 back to the second-distance sensor 193. Such that, the second-distance sensor 193 can measure a distance between the second-shield unit 15 and the second-distance sensor 193 itself by the reflected optical beam (L2), and hence to confirm that the second-shield unit 15 has been operated into the shielding state.

Figure 6:
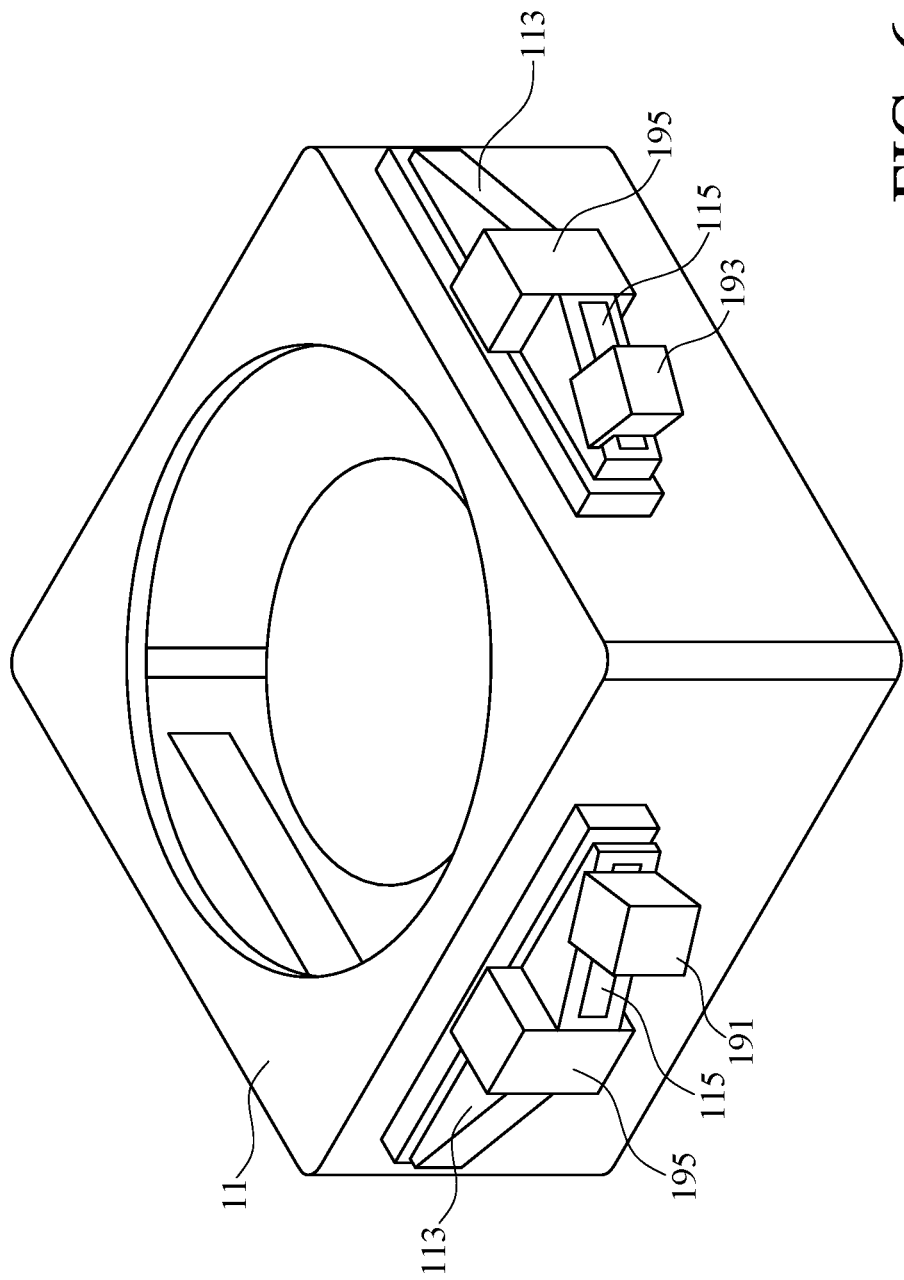
FIG. 6 is a schematic perspective view illustrating a reaction chamber of the thin-film-deposition equipment, according to one different embodiment of the present disclosure.

In one embodiment of the present disclosure, as shown in FIG. 1 and FIG. 6, the reaction chamber 11 may be disposed with two transparent windows 115, which respectively face the first-distance sensor 191 and the second-distance sensor 193 mounted outside of the reaction chamber 11, and which allow the two distance sensors 191, 193 to respectively project the optical beam (L1, L2) therethrough and into the containing space 12 of the reaction chamber 11 for detecting the two shield units 14, 15 within.

Moreover, in one embodiment of the present disclosure as shown in FIG. 4, the first-connecting arm 141 may include a first protrusion 147 with the first-reflective surface 145 thereon, in the other hand, the second-connecting arm 151 may include a second protrusion 157 with the second-reflective surface 155 formed thereon, such that to form specific portions, areas for the distance sensors 191, 193 to aim and detect.

Figure 5:
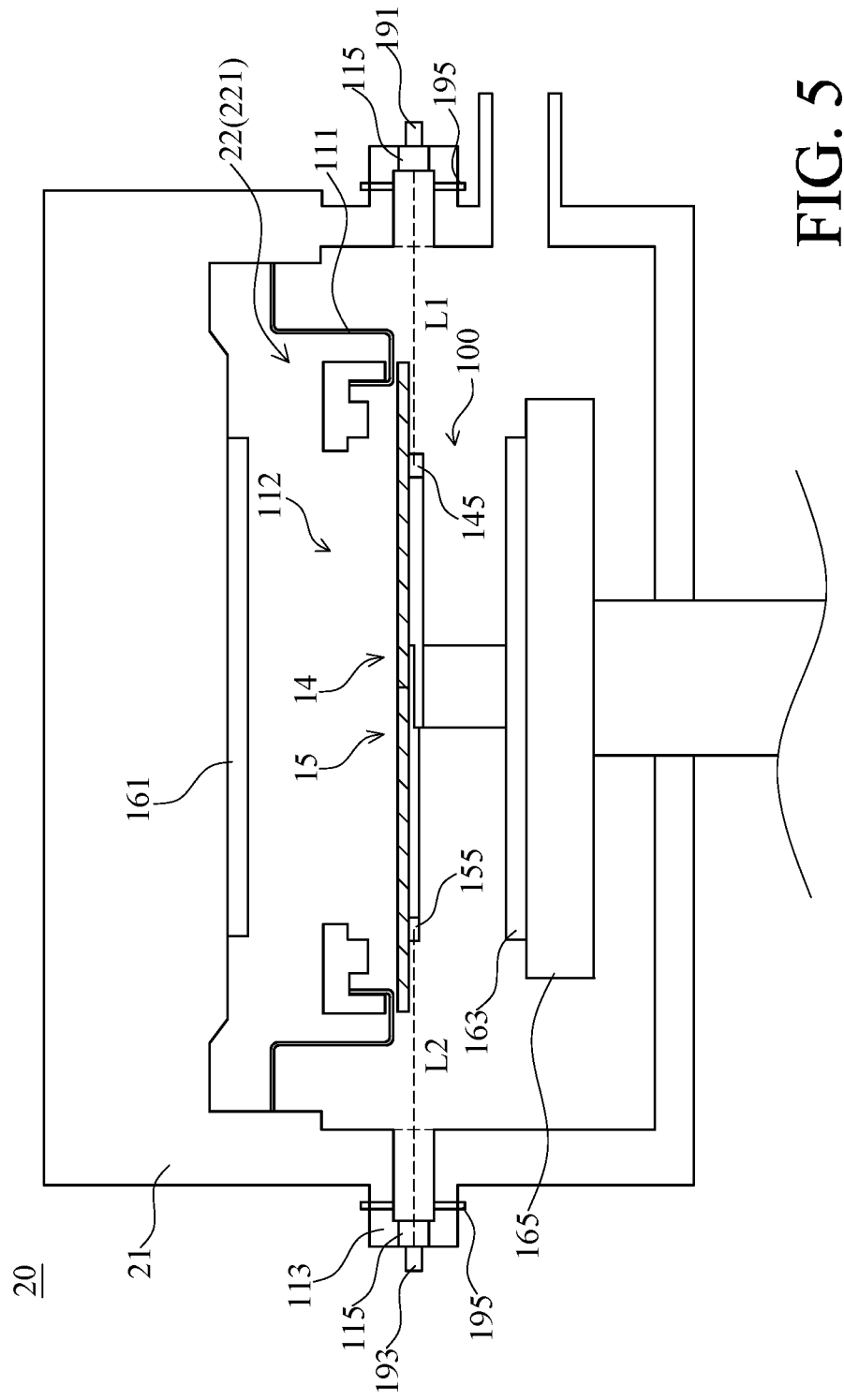
FIG. 5 is a schematic sectional view illustrating the thin-film-deposition equipment for detecting shielding mechanism which is operated into the shielding state, according to one different embodiment of the present disclosure.

Referring to FIG. 5, which is a schematic sectional view illustrating the thin-film-deposition equipment for detecting shielding mechanism 20 which is operated into the shielding state, according to one different embodiment of the present disclosure. The reaction chamber 20 in this embodiment has a structure similar to that of the aforementioned embodiment, but further includes two sensor areas 113 which are connected to and which protrude from two sides of the reaction chamber 21 respectively. In more detail, as shown in FIG. 6-FIG. 8, each of the sensor areas 113 is formed with a hollow sensing space therein which is spatially and fluidly connected to the containing space 12 of the reaction chamber 21, for partially containing the first-shield member 143 of the first-shield unit 14 and the first-shield member 153 of the second-shield unit 15 respectively when the two shield units 14, 15 are operated into the open state.

Also in this embodiment, the two sensor areas 113 are respectively disposed with the two transparent windows 115. Furthermore, the first-distance sensor 191 and the second-distance sensor 193 are respectively mounted on the two sensor areas 113 and facing the windows 115 thereon, such that to respectively project the optical beams (L1, L2) through the windows 115 and onto the first-shield unit 14 and the second-shield unit 15 within the reaction chamber 11. As shown in FIG. 8, when the two shield unit 14, 15 are operated into the shielding state, the two distance sensors 191, 193 respectively project the optical beams (L1, L2) through the windows 115 and onto the reflective surfaces 145, 155 on the two shield units 14, 15 within the containing space 22 of the reaction chamber 11, and then respectively receive the optical beams (L1, L2) reflected from the reflective surfaces 145, 155, such that to respectively detect the distances and confirm the shielding state of two shield unit 14, 15.

Moreover, in practical use, each of the sensing spaces 120 of the sensor areas 113 may also be disposed with at least one shield sensor 19 (e.g. through-beam sensors), for respectively detecting and confirming that the first-shield member 143 of the first-shield unit 14 and the second-shield member 153 of the second-shield units 15 have been operated into the open state, when each of the two shield members 143, 153 respectively enters a corresponding one of the sensing spaces 120 and intersects a signal (e.g. through beam) of the shield sensor 19 there. A1 to mention that, each of the sensor areas 113 has a height shorter than that of the reaction chamber 21, such that to facilitate mounting the shield sensors 19 from outside of the reaction chamber 21.

Figure 9:
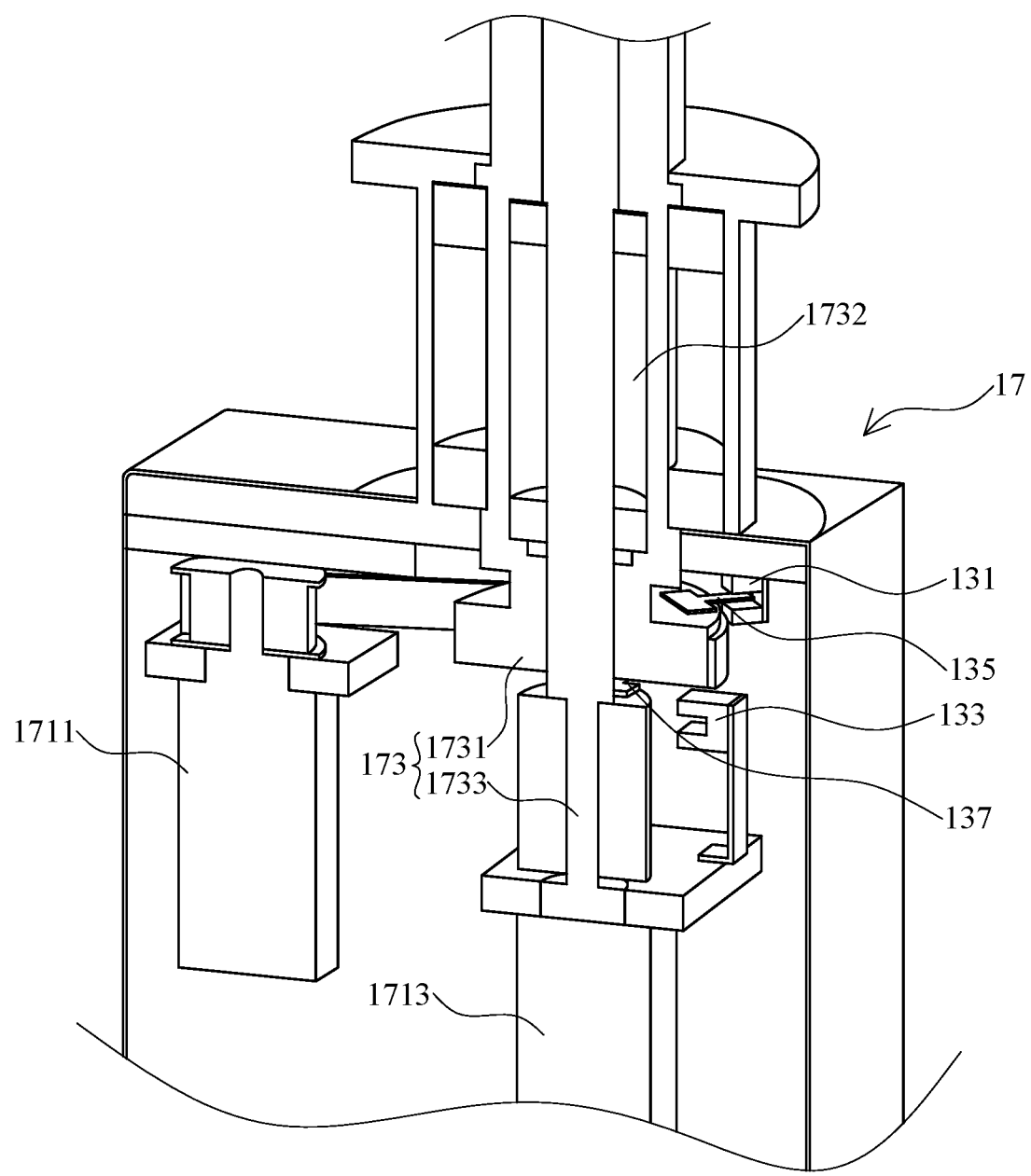
FIG. 9 is a schematic fragmentary perspective sectional view illustrating the driver of the shielding mechanism, according to another embodiment of the present disclosure.

In one embodiment of the present disclosure as shown in FIG. 9, the motor 171 may be two as a first motor 1711 and a second motor 1713, wherein the first motor 1711 is power-transmittably connected to the outer tube 1731 of the shaft seal 173, and the second motor 1713 is power-transmittably connected to the main shaft 1733 of the shaft seal 173. Such that, the first motor 1711 and the second motor 1713 respectively drive and swing the first-shield unit 14 and the second-shield unit 15 in the opposite directions, via the outer tube 1731 and the main shaft 1733.

Along therewith, the shielding mechanism 100 in this embodiment also includes the two first-position sensors 131, which are disposed adjacent to the outer tube 1731 of the shaft seal 173. In more detail, the two first-position sensors 131 have a distance therebetween, such as to be disposed at different angular positions about an axis of the outer tube 1731. To be specific, one of the two first-position sensors 131 is for detecting and confirming if the outer tube 1731 has rotated to a first position (e.g. an angular position or direction) or not, and another one of the two first-position sensors 131 is for detecting and confirming if the outer tube 1731 has rotated to a second position (e.g. an angular position or direction) or not.

In this embodiment, when the outer tube 1731 rotates to the first position, the first-shield member 151 connected thereto is operated into the open state, and when the outer tube 1731 rotates to the second position, the first-shield member 151 is operated into the shielding state. Basically, the outer tube 1731 and the first-shield member 151 are fastened to each other thus no relative movement or rotation therebetween. Therefore, it is enough to confirm and ensure the first-shield member 151 is in the shielding state or the open state, when one of the first-position sensors 131 detected that the outer tube 1731 has rotated to the first position or the second position.

In one embodiment of the present disclosure, as shown in FIG. 9, the first-position sensors 131 may be such as through-beam sensors similar to the shield sensors 195, also, the outer tube 1731 may be disposed with a first-tongue unit 135 which protrudes radially-outward therefrom. For example, the first-tongue unit 135 may be a plate or sheet formed with a pointing end and fastened on the outer tube 1731 by bolt(s) or welding, etc. When the outer tube 1731 rotates, the first-tongue unit 135 also turns to have the pointing end thereof to intersect a through beam of the corresponding first-position sensors 131 and be detected thereby, and such that the first-position sensors 131 can aid to respectively confirm the open state and the shielding state of the first-shield units 14.

Furthermore, in an advanced embodiment of the present disclosure, the shielding mechanism 100 may be further disposed with two second-position sensors 133 adjacent to the main shaft 1733 of the shaft seal 173. Similar to the first-position sensors 131, the two second-position sensors 133 also have a distance therebetween and are disposed at different angular positions about an axis of the mean shaft 1753, wherein one of the two second-position sensors 133 is for detecting and confirming if the main shaft 1733 has rotated to a third position (e.g. an angular position or direction) or not, and another one of the two second-position sensors 133 is for detecting and confirming if the main shaft 1733 has rotated to a fourth position (e.g. another angular position or direction) or not.

In this embodiment, when the main shaft 1733 rotates to the third position, the second-shield member 153 connected thereto is operated into the open state, and when the main shaft 1733 rotates to the fourth position, the second-shield member 153 is operated into the shielding state. As the main shaft 1733 and the second-shield member 153 are fastened to each other and with no relative movement or rotation therebetween, it is enough to confirm the second-shield member 153 is in the shielding state or the open state, by the second-position sensors 133 to detect the third position or the fourth position of the main shaft 1733.

Similar to the first-position sensors 133, the second-position sensors 133 may be such as through-beam sensors. Along therewith, the main shaft 1733 may be disposed with a second-tongue unit 137, which is similar to the first-tongue unit 135 and which protrudes radially-outward therefrom. Such that, when the main shaft 1733 rotates, the second-tongue unit 137 also turns and has a pointing end thereof to intersect, block a through beam of the second-position sensors 133 and be detected thereby, and such that the second-position sensors 133 can aid to respectively confirm the open state and the shielding state of the second-shield units 15.

However surely, such detecting mechanism of the positon sensors 131, 133 and tongue units 135, 137 may also be applied in the embodiment of FIG. 3, with one single motor 171 to respectively drive and turn the outer tube 1731 and the main shaft 1733 in the opposite directions, and be detected by the positon sensors 131, 133.

Figure 10:
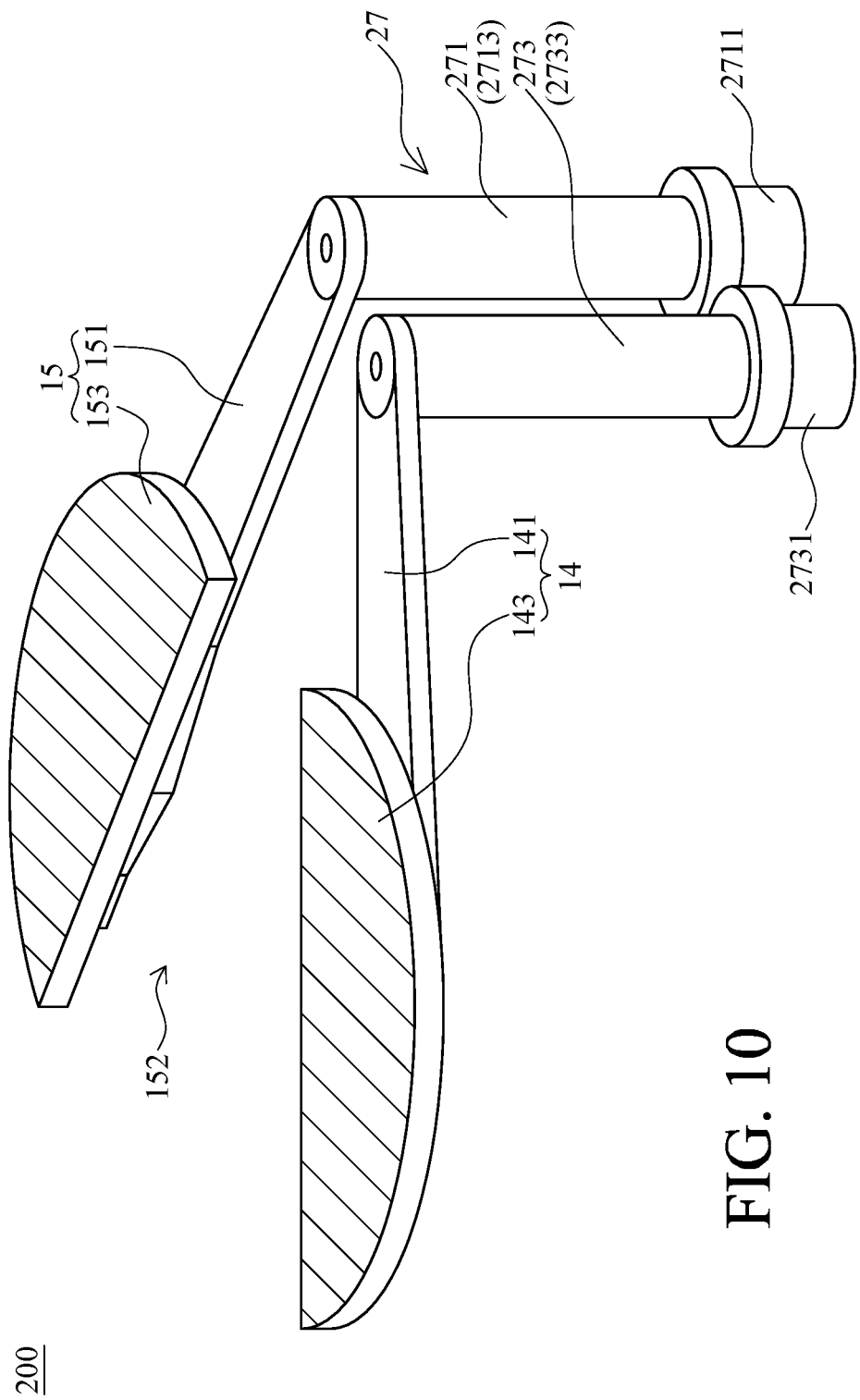
FIG. 10 is a schematic perspective view illustrating the shielding mechanism which is operated into the open state, according to one more embodiment of the present disclosure.
Figure 11:
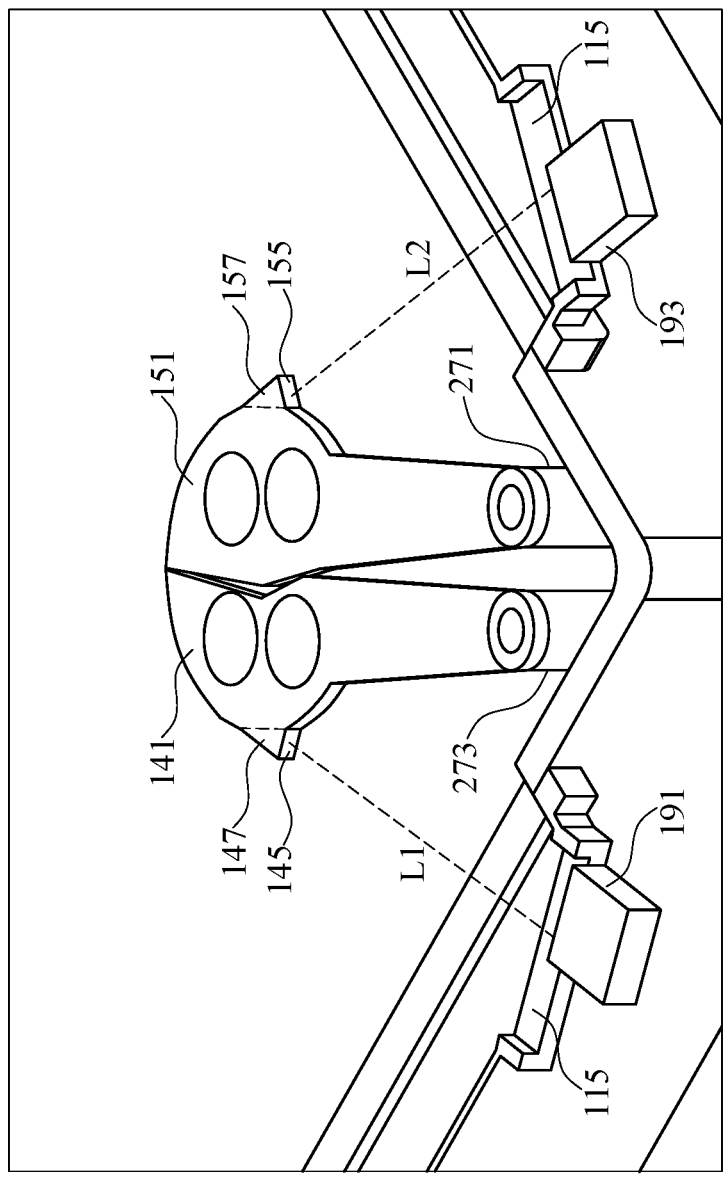
FIG. 11 is a schematic fragmentary perspective view illustrating the thin-film-deposition equipment for detecting shielding mechanism which is operated into the shielding state, according to one more embodiment of the present disclosure.

Referring to FIG. 10 and FIG. 11, wherein FIG. 10 is a schematic perspective view illustrating the shielding mechanism 200 of the thin-film-deposition equipment which is in the open state, and FIG. 11 is a schematic fragmentary perspective view illustrating the thin-film-deposition equipment for detecting shielding mechanism which is operated into the shielding state, according to one more embodiment of the present disclosure. In comparison with the aforementioned embodiment, the driver 27 in this embodiment is configured as a first driver 271 and a second driver 273. The first driver 271 and the second driver 273 are respectively connected power-transmittably to the first-shield member 143 and the second-shield member 153 via the first-connecting arm 141 and the second-connecting arm 151, such that to drive and swing the first-shield unit 14 and the second-shield unit 15 to move in the opposite rotational directions. For example, the first-shield unit 14 and the second-shield unit 15 may synchronously sway in the opposite rotational directions, respectively about an axle of the first driver 271 and an axle of the second driver 273.

In more detail, each of the first driver 271 and the second driver 273 includes at least one and a shaft seal 2713, 2733, which are structures similar to the aforementioned single motor 171 and shaft seal 173. Such that, the motor 2711, 2731 of the two drivers 271, 273 can respectively drive and turn the shaft seals 2713, 2733 to rotate in the opposite directions, and hence to further swing the first-shield unit 14 and the second-shield unit 15 thereon to move into the open state or into the shielding state.

As shown in FIG. 11, in this embodiment, the first-shield unit 14 driven by the first driver 271 has the first-reflective surface 145 thereon to be detected by the first-distance sensor 191, in the other hand, the second-shield unit 15 driven by the second driver 273 has the second-reflective surface 155 thereon to be detected by the second-distance sensor 193. With such arrangement, the distance sensors 191, 193 can serve to detect and confirm the shielding state of the shield units 14, 15 as well.

Also, similar to the embodiment of FIG. 9, in an advanced embodiment, each of the first driver 171 and the second driver 173 may has the shaft seals 2713, 2733 thereof disposed with the first-tongue unit 135 and the second-tongue unit 137, also to combine with the first-position sensors 131 and the second-position sensors 133. Such that, as the two drivers 271, 273 respectively drive and swing the two shield units 14, 15 into the shielding state or the open state, each of the position sensors 131, 133 can aid to detect that each of the shaft seals 2713, 2733 has rotated to their preset positions (similar to the aforementioned first and second positions, or third and fourth positions), and thus to confirm the shielding state or the open state of the two shielding units 14, 15.

In summary, by virtue of disposing the distance sensors 191, 193, and further with the shield sensors 195, also the position sensors 131, 133, the thin-film-deposition 100 according to the present disclosure is able to confirm and ensure if the two shield units 14, 15 are operated into the shielding state or the open state. Thereby, the thin-film-deposition 100 is able to prevent the burn-in process for cleaning the reaction chamber 11 from starting when the two shield units 14, 15 are not exactly in the shielding state and hence causing pollution to the carrier 165. In the opposite manner, the thin-film-deposition 100 is also able to prevent the carrier 165 from moving toward the target material 161 when the two shield units 14, 15 are not exactly in the open state and hence causing collision between the carrier 165 and the shield unit 151, 153.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A thin-film-deposition equipment for detecting shielding mechanism, comprising:
   a reaction chamber comprising a containing space;
   a carrier disposed within the containing space for carrying at least one substrate thereon; and
   a shielding mechanism comprising:
      a first-shield unit that is disposed within the containing space and that includes a first-reflective surface;
      a second-shield unit that is disposed within the containing space and that includes a second-reflective surface;
      at least one driver interconnecting the first-shield unit and the second-shield unit to respectively drive and swing the first-shield unit and the second-shield unit in opposite directions and between an open state and a shielding state, wherein in the shielding state, the first-shield unit and the second-shield unit approach each other to cover the carrier; and wherein in the open state, the first-shield unit and the second-shield unit have an open space therebetween; and
      a first-distance sensor disposed on the reaction chamber and projecting a first-optical beam onto the first-reflective surface of the first-shield unit for detecting and confirming that the first-shield unit is operated into the shielding state; and
      a second-distance sensor disposed on the reaction chamber and projecting a second-optical beam onto the second-reflective surface of the first-shield unit for detecting and confirming that the second-shield unit is operated into the shielding state.

2. The thin-film-deposition equipment according to claim 1, comprising two sensor areas that are connected to and that protrude from the reaction chamber for partially containing the first-shield unit and the second-shield unit in the open state respectively, wherein each of the sensor areas is formed with a height shorter than that of the reaction chamber.

3. The thin-film-deposition equipment according to claim 2, further comprising two shield sensors respectively disposed on the two sensor areas, for respectively detecting that the first-shield unit and the second-shield unit have entered the sensor areas, to confirm that the first-shield unit and the second-shield unit are operated into the open state.

4. The thin-film-deposition equipment according to claim 1, wherein the first-shield unit comprises a first-connecting arm and a first-shield member, the at least one driver is connected to the first-shield member via the first-connecting arm, the first-reflective surface is disposed on the first-connecting arm; and the second-shield unit comprises a second-connecting arm and a second-shield member, the at least one driver is connected to the second-shield member via the second-connecting arm, the second-reflective surface is disposed on the second-connecting arm.

5. The thin-film-deposition equipment according to claim 4, wherein the first-connecting arm of the first-shield unit comprises a first protrusion disposed with the first reflective surface thereon; and the second-connecting arm of the second-shield unit comprises a second protrusion disposed with the second-reflective surface thereon.

6. The thin-film-deposition equipment according to claim 1, wherein in the shielding state, the first-optical beam of the first-distance sensor is projected on the first-reflective surface of the first-shield unit in a perpendicular manner, and the second-optical beam of the second-distance sensor is projected on the second-reflective surface of the second-shield unit in a perpendicular manner.

7. The thin-film-deposition equipment according to claim 1, wherein the at least one driver comprises a shaft seal and at least one motor; the shaft seal comprises an outer tube and a main shaft contained within the outer tube; the at least one motor is connected to the first-shield unit via the outer tube; the at least one motor is connected to the second-shield unit via the main shaft; and the at least one motor drives the outer tube and the main shaft to respectively swing the first-shield unit and the second-shield unit in the opposite directions synchronously.

8. The thin-film-deposition equipment according to claim 7, further comprising two first-position sensors that are disposed adjacent to the outer tube of the shaft seal for respectively detecting that the outer tube has rotated to a first position and detecting that the outer tube has rotated to a second position, wherein when the outer tube rotates to the first position, the first-shield unit is operated into the open state; and when the outer tube rotates to the second position, the first-shield unit is operated into the shielding state.

9. The thin-film-deposition equipment according to claim 8, further comprising two second-position sensors that are disposed adjacent to the main shaft of the shaft seal for respectively detecting that the main shaft tube has rotated to a third position and detecting that the main shaft has rotated to a fourth position; when the main shaft rotates to the third position, the second-shield unit is operated into the open state; and when the main shaft rotates to the fourth position, the second-shield unit is operated into the shielding state.

10. The thin-film-deposition equipment according to claim 9, further comprising a first-tongue unit and a second-tongue unit, wherein the first-tongue unit is connected to the outer tube; the second-tongue unit is connected to the main shaft; the first-tongue unit rotates with the outer tube to be detected by the first-position sensors; and the second-tongue unit rotates with the main shaft to be detected by the second-position sensors.

11. A thin-film-deposition equipment for detecting shielding mechanism, comprising:
   a reaction chamber comprising a containing space;
   a carrier disposed within the containing space for carrying at least one substrate thereon; and
   a shielding mechanism comprising:
      a first-shield unit that is disposed within the containing space and that includes a first-reflective surface;
      a second-shield unit that is disposed within the containing space and that includes a second-reflective surface;
      a first driver that is connected to the first-shield unit and that drives and swings the first-shield unit;
      a second driver that is connected to the second-shield unit and that drives and swings the second-shield unit, wherein the first driver and the second driver respectively drive and swing the first-shield unit and the second-shield unit in opposite directions and between an open state and a shielding state, wherein in the shielding state, the first-shield unit and the second-shield unit approach each other to cover the carrier; and wherein in the open state, the first-shield unit and the second-shield unit have an open space therebetween; and
   a first-distance sensor disposed on the reaction chamber and projecting a first-optical beam onto the first-reflective surface of the first-shield unit for detecting and confirming that the first-shield unit is operated into the shielding state; and
   a second-distance sensor disposed on the reaction chamber and projecting a second-optical beam onto the second-reflective surface of the first-shield unit for detecting and confirming that the second-shield unit is operated into the shielding state.

12. The thin-film-deposition equipment according to claim 11, comprising two sensor areas that are connected to and that protrude from the reaction chamber for partially containing the first-shield unit and the second-shield unit in the open state respectively, wherein each of the sensor areas is formed with a height shorter than that of the reaction chamber.

13. The thin-film-deposition equipment according to claim 12, further comprising two shield sensors respectively disposed on the two sensor areas, for respectively detecting that the first-shield unit and the second-shield unit have entered the sensor areas, to confirm that the first-shield unit and the second-shield unit are operated into the open state.

14. The thin-film-deposition equipment according to claim 11, wherein the first-shield unit comprises a first-connecting arm and a first-shield member, the driver is connected to the first-shield member via the first-connecting arm, the first-reflective surface is disposed on the first-connecting arm; and the second-shield unit comprises a second-connecting arm and a second-shield member, the driver is connected to the second-shield member via the second-connecting arm, the second-reflective surface is disposed on the second-connecting arm.

15. The thin-film-deposition equipment according to claim 14, wherein the first-connecting arm of the first-shield unit comprises a first protrusion disposed with the first reflective surface thereon; and the second-connecting arm of the second-shield unit comprises a second protrusion disposed with the second-reflective surface thereon.

16. The thin-film-deposition equipment according to claim 11, wherein in the shielding state, the first-optical beam of the first-distance sensor is projected on the first-reflective surface of the first-shield unit in a perpendicular manner, and the second-optical beam of the second-distance sensor is projected on the second-reflective surface of the second-shield unit in a perpendicular manner.

17. The thin-film-deposition equipment according to claim 11, wherein each of the first driver and the second driver comprises a shaft seal and at least one motor; the at least one motor of the first driver is connected to the first-shield unit via the shaft seal of the first driver; and the at least one motor of the second driver is connected to the second-shield unit via the shaft seal of the second driver.

18. The thin-film-deposition equipment according to claim 17, further comprising two first-position sensors that are disposed adjacent to the shaft seal of the first driver for respectively detecting that the shaft seal of the first driver has rotated to a first position and detecting that the outer tube has rotated to a second position, wherein when the shaft seal of the first driver rotates to the first position, the first-shield unit is operated into the open state; and when the shaft seal of the first driver rotates to the second position, the first-shield unit is operated into the shielding state.

19. The thin-film-deposition equipment according to claim 18, further comprising two second-position sensors that are disposed adjacent to the shaft seal of the second driver for respectively detecting that the shaft seal of the second driver has rotated to a third position and detecting that the shaft seal of the second driver has rotated to a fourth position; when the shaft seal of the second driver rotates to the third position, the second-shield unit is operated into the open state; and when the shaft seal of the second driver rotates to the fourth position, the second-shield unit is operated into the shielding state.

20. The thin-film-deposition equipment according to claim 19, further comprising a first-tongue unit and a second-tongue unit, wherein the first-tongue unit is connected to the shaft seal of the first driver; the second-tongue unit is connected to the shaft seal of the second driver; the first-tongue unit rotates with the shaft seal of the first driver to be detected by the first-position sensors; and the second-tongue unit rotates with the shaft seal of the second driver to be detected by the second-position sensors.

* * * * *